United States Patent
Yang et al.

(10) Patent No.: US 9,736,953 B2
(45) Date of Patent: Aug. 15, 2017

(54) PRESSURE COMPENSATION DEVICE AND ECU MODULE INCLUDING THE SAME

(71) Applicant: Hyundai Autron Co., Ltd., Gyeonggi-do (KR)

(72) Inventors: Sun-Jae Yang, Uiwang-si (KR); Chang-Ju Kim, Uijeongbu-si (KR); Hyung-Joon Moon, Seoul (KR); Seung-Mok Song, Seongnam-si (KR); Chang-Geun Shin, Yongin-si (KR); Jun Ho Lee, Seoul (KR); Yeon-Chul Choo, Seoul (KR)

(73) Assignee: Hyundai Autron Co., Ltd., Seongnam-si (KR)

( * ) Notice: Subject to any disclaimer, the term of this patent is extended or adjusted under 35 U.S.C. 154(b) by 0 days.

(21) Appl. No.: 14/952,268

(22) Filed: Nov. 25, 2015

(65) Prior Publication Data

US 2016/0157390 A1    Jun. 2, 2016

(30) Foreign Application Priority Data

Nov. 27, 2014    (KR) .................. 10-2014-0167623

(51) Int. Cl.
*H05K 7/20*    (2006.01)
*H05K 5/02*    (2006.01)
*H01L 23/473*    (2006.01)

(52) U.S. Cl.
CPC .................................. *H05K 5/0213* (2013.01)

(58) Field of Classification Search
CPC . G06F 1/181–1/182; H05K 7/20218–7/20381;
(Continued)

(56) References Cited

U.S. PATENT DOCUMENTS 5,079,672 A * 1/1992 Haubner ................. H01L 25/16
                                                        165/185
5,241,131 A * 8/1993 Bakhru ............... H01L 23/4336
                                                        174/15.1
(Continued)

FOREIGN PATENT DOCUMENTS

DE          8408092 U1    3/1984
DE        199 46 825 C1   2/2001
(Continued)

OTHER PUBLICATIONS

German Office Action, dated May 10, 2017, for German Patent Application No. 102015223596.3.

*Primary Examiner* — Anthony Haughton
*Assistant Examiner* — Razmeen Gafur
(74) *Attorney, Agent, or Firm* — Morgan Lewis & Bockius LLP

(57) ABSTRACT

Disclosed herein is a pressure compensation device for securing the air permeability of the electronic control unit (ECU) of a vehicle. A pressure compensation device according to an aspect of the present invention includes a vent unit integrated with a connector on a part of an ECU on which an electronic control element is mounted, wherein a vent hole penetrating the inside and outside of the case of the ECU in which the electronic control element is received is formed in the vent unit and a cover unit integrated with a vehicle-side connector in such a way as to form electrical connection with the ECU and configured to form a protection wall by covering part of the upper side of the vent unit when the ECU-side connector and the vehicle-side connector are coupled.

22 Claims, 8 Drawing Sheets

(58) Field of Classification Search
CPC ............... H05K 7/20409–7/20418; H05K 7/20009–7/202; H01L 23/367–23/3677; H01L 23/473; H01L 23/46–23/467
USPC ...... 361/676–678, 679.46–679.54, 688–723, 361/756, 741, 686, 687, 725, 787, 789, 361/794, 807–810; 165/80.1–80.5, 165/104.33, 185; 174/15.1–15.3, 174/16.1–16.3, 547, 548; 257/712–722, 257/E23.088; 24/453, 458–459; 454/184; 312/236; 348/787, 789, 794; 349/56–60
See application file for complete search history.

(56) References Cited

U.S. PATENT DOCUMENTS

| | | | | |
|---|---|---|---|---|
| 5,526,232 | A * | 6/1996 | Kolberg | B60Q 1/0094 361/715 |
| 6,396,692 | B1 * | 5/2002 | Farshi | H05K 7/20254 123/41.31 |
| 6,600,653 | B2 * | 7/2003 | Koike | H05K 5/0043 123/41.31 |
| 6,604,494 | B2 * | 8/2003 | Skrzypchak | F01P 3/12 123/41.31 |
| 8,437,135 | B2 * | 5/2013 | Hurmer | B60K 6/22 165/104.33 |
| 9,237,678 | B2 * | 1/2016 | Arai | H05K 7/20936 |
| 2002/0154486 | A1 * | 10/2002 | Koike | H05K 5/0073 361/704 |
| 2003/0016499 | A1 * | 1/2003 | Tanaka | H05K 7/20309 361/700 |
| 2004/0134549 | A1 * | 7/2004 | Albert | F16H 61/0009 137/884 |
| 2005/0057902 | A1 * | 3/2005 | Sasaki | B60R 16/0239 361/717 |
| 2005/0241803 | A1 * | 11/2005 | Malone | G06F 1/20 165/80.4 |
| 2006/0043551 | A1 * | 3/2006 | Yamauchi | H01L 23/3677 257/678 |
| 2008/0259566 | A1 * | 10/2008 | Fried | F28D 15/0266 361/699 |
| 2010/0302728 | A1 * | 12/2010 | Knaup | H05K 7/20918 361/690 |
| 2011/0083824 | A1 * | 4/2011 | Rogers | H05K 7/20745 165/80.2 |
| 2012/0111546 | A1 * | 5/2012 | Peterle | F24H 9/2071 165/148 |
| 2012/0261007 | A1 * | 10/2012 | Pieprzyk | B01L 3/502738 137/505 |
| 2013/0010426 | A1 * | 1/2013 | Nakano | H02K 11/33 361/690 |
| 2013/0040480 | A1 * | 2/2013 | Frey | F04B 47/06 439/199 |
| 2013/0145820 | A1 * | 6/2013 | Boahene | F01N 13/008 73/23.31 |
| 2013/0220161 | A1 * | 8/2013 | Coppedge | C06D 5/00 102/531 |
| 2013/0323083 | A1 * | 12/2013 | Maguin | F01N 3/2066 417/32 |
| 2013/0340361 | A1 * | 12/2013 | Rogers | H05K 7/20745 52/173.1 |

FOREIGN PATENT DOCUMENTS

| | | |
|---|---|---|
| JP | 10-199608 A | 7/1998 |
| JP | 10-199613 A | 7/1998 |
| JP | 2003-63325 A | 3/2003 |
| JP | 2006-523945 A | 10/2006 |
| JP | 2007-141959 A | 6/2007 |
| JP | 2008-55981 A | 3/2008 |
| JP | 2008-78506 A | 4/2008 |
| JP | 2012-136172 A | 7/2012 |
| JP | 5016072 B2 | 9/2012 |
| KR | 10-2013-0007099 A | 1/2013 |
| WO | WO 2013/110639 A1 | 8/2013 |

* cited by examiner

Detail "A"

PRESSURE COMPENSATION DEVICE AND ECU MODULE INCLUDING THE SAME

CROSS REFERENCE TO RELATED APPLICATION

The present application claims the benefit of Korean Patent Application No. 10-2014-0167623 filed in the Korean Intellectual Property Office on Nov. 27, 2014, the entire contents of which are incorporated herein by reference.

BACKGROUND OF THE INVENTION

Technical Field

The present invention relates to a pressure compensation device and, more particularly, to a pressure compensation device applied in order to secure the air permeability of an electronic control unit (hereinafter referred to as an "ECU") on which an electronic control element for electrically controlling the parts of a vehicle has been mounted and an ECU module including the pressure compensation device.

Description of the Related Art

In general, an ECU for electronically controlling various devices is mounted on a vehicle. The ECU receives information from sensors or switches installed in the parts of a vehicle, and it performs a variety of types of electronic control for optimizing vehicle performance and improving ride comfort and safety or providing various types of convenience to a driver and a passenger by processing the received information.

For example, an ECU for electronically controlling the operations of the engine, automatic transmission, and ABS of a vehicle functions to electronically control all the parts of a vehicle, such as a driving system, a brake system, and a steering system in addition to control of an automatic transmission in line with the development of vehicle and computer performance.

A conventional ECU applied to a vehicle includes a case configured to have a receipt space formed in the case and a PCB configured to be inserted into the case and further includes a connector coupled with the front end of the PCB for electrical connection with the vehicle side. The case may include a cover and a base and is assembled in such a way as to surround the PCB.

The ECU has high-integrated control circuit means and thus has a possibility that it may be subject to a fatal malfunction if external moisture or an alien substance is introduced into the ECU or if the ECU is overheated or internal pressure of the ECU rises due to heat generated when a circuit is driven. For this reason, the ECU must have a construction capable of satisfying air permeability against the outside while maintaining a high degree of sealing.

Japanese Patent Application Publication No. 2008-078506 in which a vent hole is formed in a case for receiving a PCB and a stopper type filter having a flow passage is installed in the vent hole and Japanese Patent Application Publication No. 2008-055981 in which a vent hole is formed in a case and the vent hole is covered with a filter film using an adhesion sheet were suggested as conventional arts for securing air permeability against the outside.

The stopper type disclosed in Japanese Patent Application Publication No. 2008-078506 has an effective structure capable of satisfying both air permeability and sealing, but it is low in competitiveness in terms of product mass productivity and a production cost because the stopper type requires an additional assembly process because a separate pressure compensation device, such as the stopper type filter, is used and a cost rises.

In contrast, the sheet type disclosed in Japanese Patent Application Publication No. 2008-055981 is advantageous in that it can simplify the assembly process and reduce a production cost because it has a simple construction compared to Japanese Patent Application Publication No. 2008-078506, but is problematic in that it does not satisfy a waterproof property against high-pressure spray corresponding to International Protection (IP) 9K in the classification of IEC Standard 60529.

PRIOR ART DOCUMENT

Patent Document (Patent Document 0001) Japanese Patent Application Publication No. 2008-078506 (Apr. 3, 2008)

(Patent Document 0002) Japanese Patent Application Publication No. 2008-055981 (Mar. 13, 2008).

SUMMARY OF THE INVENTION

An object of the present invention is to provide a pressure compensation device capable of satisfying the simplification of a construction and an assembly process and a reduction of a production cost and an ECU module including the same.

Another object of the present invention is to provide a pressure compensation device capable of satisfying a waterproof property against high-pressure spray and an ECU module including the same.

In accordance with an aspect of the present invention, a pressure compensation device includes a vent unit integrated with a connector on a part of an ECU on which an electronic control element is mounted, wherein a vent hole penetrating the inside and outside of the case of the ECU in which the electronic control element is received is formed in the vent unit and a cover unit integrated with a vehicle-side connector in such a way as to form electrical connection with the ECU and configured to form a protection wall by covering part of the upper side of the vent unit when the ECU-side connector and the vehicle-side connector are coupled.

The vent unit to which an embodiment of the present invention has been applied may be formed in a flat panel type flange on an outside of a bottom of a connection part of the ECU-side connector. The cover unit may be formed on the side of the vehicle-side connector in a location corresponding to the vent unit when the ECU-side connector and the vehicle-side connector are coupled.

Furthermore, the vent unit may include a pressure control part formed in the height direction of the connection part of the ECU-side connector, wherein a cross section of the pressure control part in which the vent hole is formed along the central part of the pressure control part may be angular or circular and a separation membrane installed at the entrance of the vent hole on the inside of the case of the ECU.

In this case, an inclined surface including the exit of the vent hole may be formed at the front end of the pressure control part. In this case, the inclined surface may be formed on the side facing the side of the connection part of the ECU-side connector.

Furthermore, a concave unit in which the separation membrane is installed may be formed around the entrance of the vent hole.

Furthermore, the cover unit may include a side member configured to surround the upper side of the vent unit and a top member on top of the side member.

The pressure compensation device in accordance with an embodiment of the present invention may further include a barrier member placed between the vent unit and the connection part of the ECU-side connector when the ECU-side connector and the vehicle-side connector are coupled.

An alien substance introduction prevention piece may be installed on one surface of the barrier member facing the vent unit or the external surface of the vent unit facing the barrier member.

In some embodiments, alien substance introduction prevention pieces may be alternately installed up and down at a specific interval in a face in which the vent unit and the barrier member face each other.

Another aspect of the present invention provides an ECU module, including an ECU configured to have an electronic control element mounted on a case and a connector forming electrical connection with the electronic control element coupled to one side of the case, a vehicle-side connector coupled to the ECU-side connector in such a way as to form electrical connection with the ECU-side connector, and a pressure compensation device according to the one aspect.

DESCRIPTION OF REFERENCE NUMERALS

| | |
|---|---|
| 1: ECU module | 10: ECU |
| 11: case | 12: ECU-side connector |
| 16: vehicle-side connector | |
| 20: pressure compensation device | 22: vent unit |
| 26: cover unit | 28: barrier member |
| 29: alien substance introduction prevention piece | |
| 110: cover | 112: base |
| 120: connection part | 122: flange |
| 124: outer pins | 160: fastening part |
| 162: insulating cover | 220: pressure control part |
| 221: inclined surface | 224: vent hole |
| 226: separation membrane | 228: concave unit |

DETAILED DESCRIPTION

Hereinafter, some embodiments of the present invention are described in detail with reference to the exemplary drawings. The embodiments are provided so that those skilled in the art may easily understand the technical spirit of the present invention and the present invention is not restricted by the embodiments. A detailed description of the known functions and constructions will be omitted if it is deemed to make the gist of the present invention unnecessarily vague.

Figure 1:
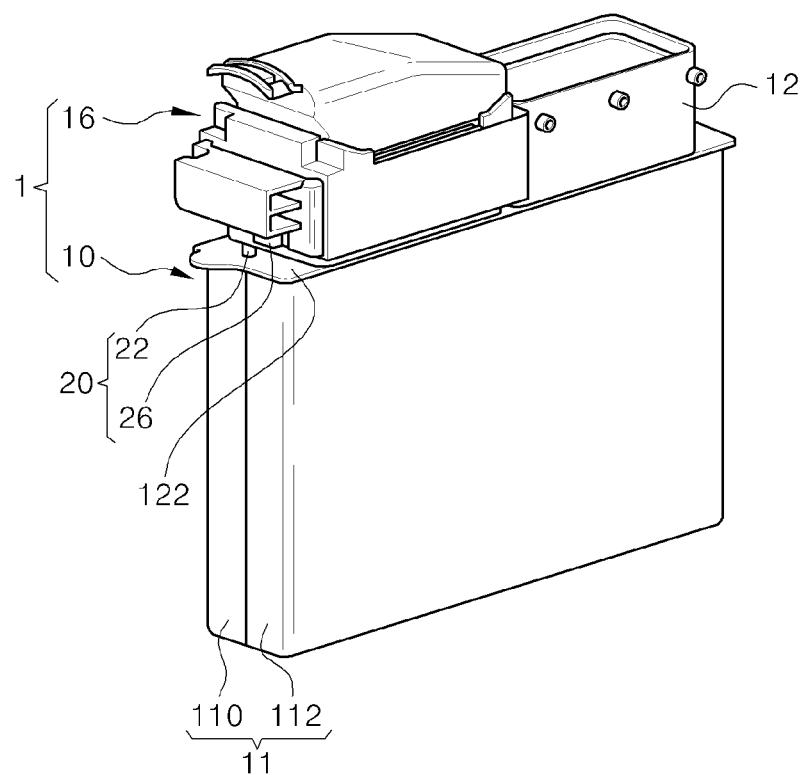
FIG. 1 is a separated perspective view of an ECU module to which a pressure compensation device in accordance with an embodiment of the present invention has been applied.
Figure 2:
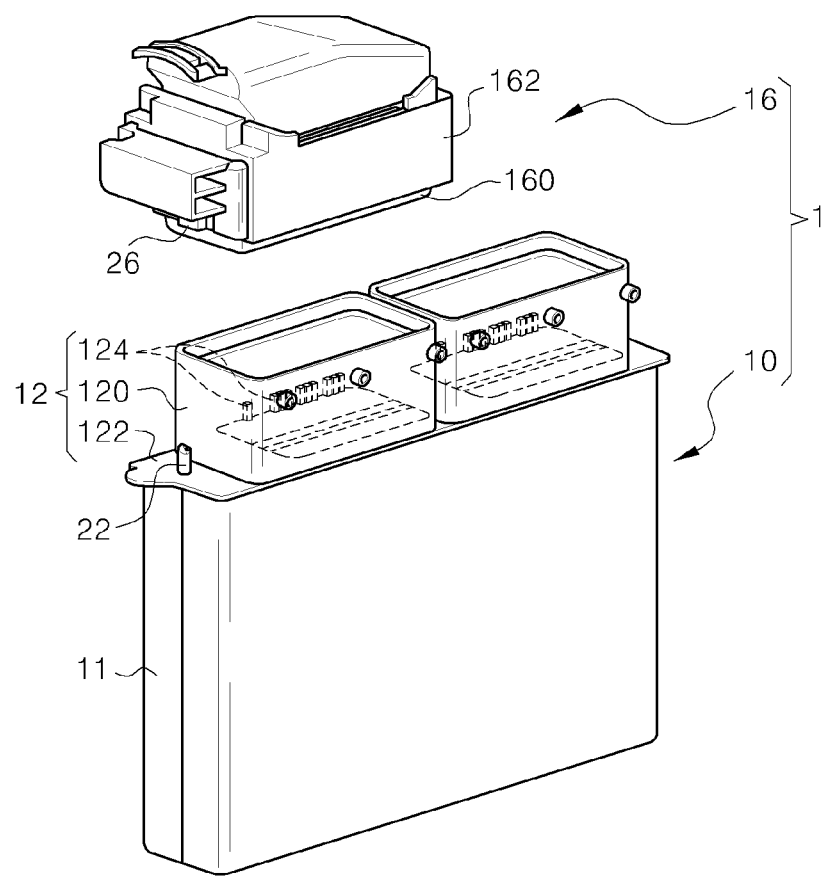
FIG. 2 is a combination perspective view of the ECU module to which the pressure compensation device in accordance with an embodiment of the present invention has been applied.

FIG. 1 is a separated perspective view of an ECU module to which a pressure compensation device in accordance with an embodiment of the present invention has been applied, and FIG. 2 is a combination perspective view of the ECU module to which the pressure compensation device in accordance with an embodiment of the present invention has been applied.

Figure 3:
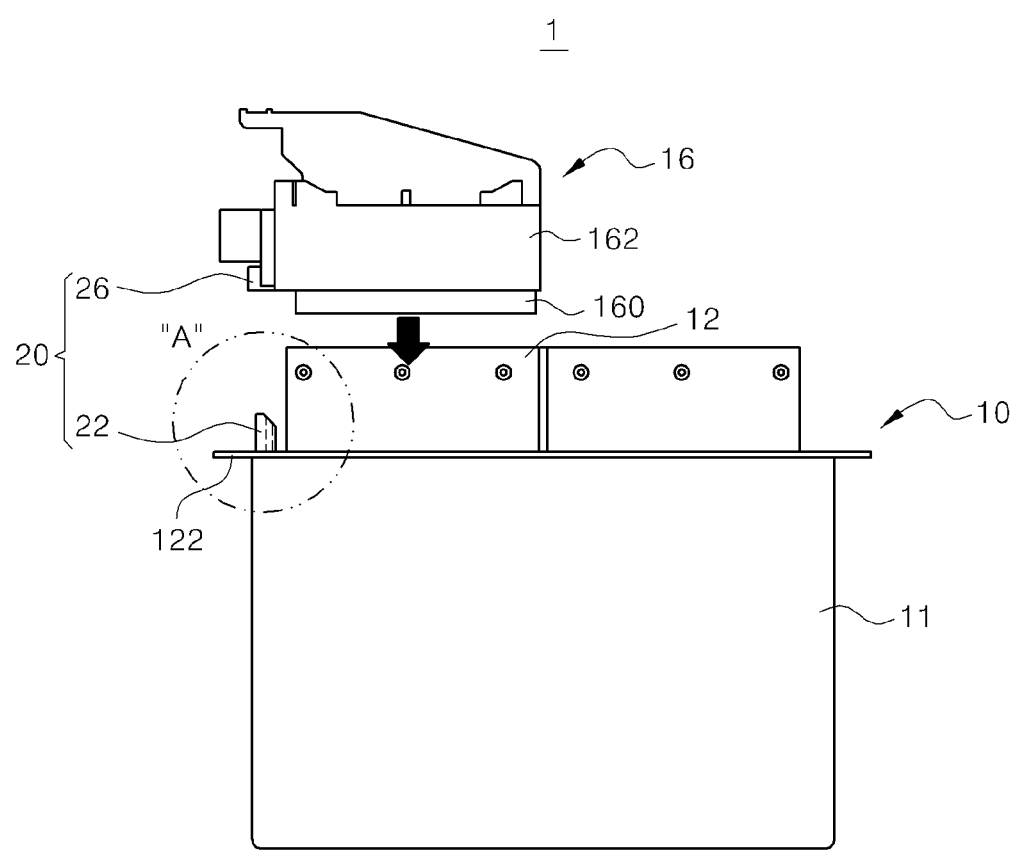
FIG. 3 is a diagram showing the state in which from which the ECU and a vehicle-side connector have been separated, which is seen from the front.

Furthermore, FIG. 3 is a diagram showing the state in which from which the ECU and a vehicle-side connector have been separated, which is seen from the front. The configuration of the ECU module to which the pressure compensation device in accordance with an embodiment of the present invention has been applied is described in detail below.

Referring to FIGS. 1 to 3, the ECU module 1 according to an embodiment of the present invention basically includes an ECU 10 configured to have an electronic control element (not shown) for electrically controlling the parts of a vehicle mounted on the ECU and a vehicle-side connector 16 (i.e., a harness-side connector) engaged with a connector 12 provided on one side of the ECU 10 so that firm electrical connection is achieved.

The ECU 10 includes the electronic control element and a case 11 configured to surround and protect the electronic control element. The electronic control element may include a PCB on which integrated control circuit means for electrically controlling the parts of a vehicle has been mounted. The case 11 may have a box type structure having an internal mounting space so that the electronic control element (hereinafter called a "PCB") is mounted on the case.

The case 11 is divided into a cover 110 and a base 112. The case 11 may have a single structure in which the cover 110 on the upper side and the base 112 on the lower side are combined with the PCB interposed there between in such a way as to receive the PCB. For example, the case 11 may include all types of barrel type structures capable of receiving the PCB, including a single rectangular structure in which a cross section in which the receipt space of the PCB is formed is angular.

The connector 12 (hereinafter called an "ECU-side connector") is coupled to the vehicle-side connector 16 at the opening stage of the case 11 on one side thereof so that electrical connection with the vehicle-side connector 16 is formed. The ECU-side connector 12 includes a plurality of inner pins (not shown) configured to form electrical connection with the PCB side mounted on the case 11 and a plurality of outer pins 124 configured to form electrical connection with the vehicle-side connector 16.

The outer pins 124 are exposed outside the case 11. A connection part 120 surrounds the surroundings of the outer pins 124 higher than the outer pins 124. A portion in which coupling units between the elements forming the ECU 10, for example, a coupling unit and the connector 12 between the cover 110 and the base 112 connect to the cover 110 and the base 112 is sealed in a close structure so that an external alien substance or moisture is not introduced into the portion.

The vehicle-side connector 16 (i.e., the harness connector) includes a fastening part 160 adapted to be inserted into the connection part 120 of the ECU-side connector 12 in such a way as to be engaged with the connection part 120 and an insulating cover 162 configured to surround the fastening part 160. Inner holes (not shown) are formed in the fastening part 160 in accordance with the outer pins 124. A cable extended from the vehicle side is electrically connected to each of the parts of the inner holes in order to exchange pieces of information with each of the parts of the vehicle side.

The ECU module 1 formed of the ECU 10 and the vehicle-side connector 16 further includes a pressure compensation device 20 in accordance with an embodiment of the present invention in order to block the introduction of external moisture or an alien substance into the case 11 and to compensate for the discharge of heat generated when a circuit is driven and pressure within the case identically with the outside.

The pressure compensation device 20 may include a vent unit 22 configured to be integrated with the ECU-side connector 12 and a cover unit 26 configured to be integrated with the vehicle-side connector 16. The configuration of the pressure compensation device applied to the ECU module is described in more detail with reference to FIGS. 4 to 6.

Figure 4A:
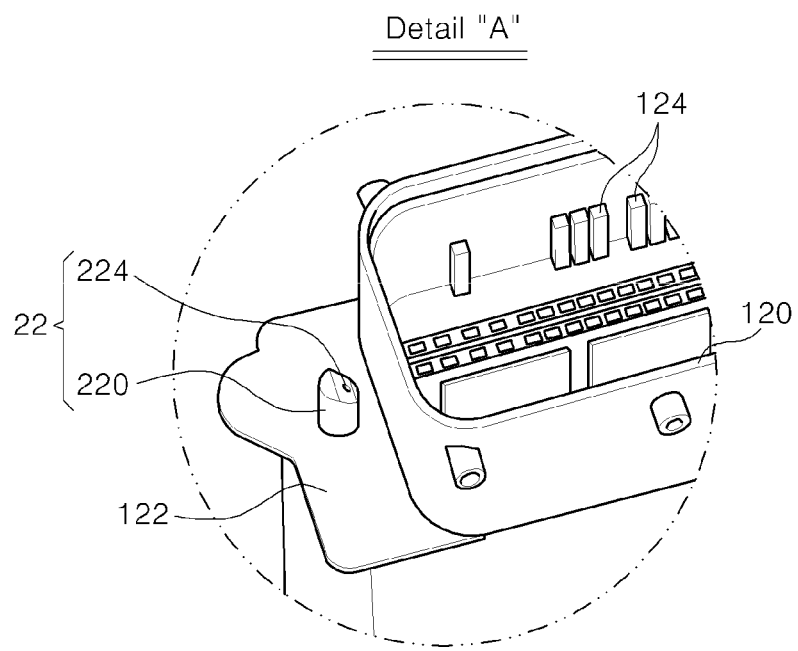
FIG. 4A is an enlarged perspective view of circle "A" in FIG. 3.
Figure 4B:
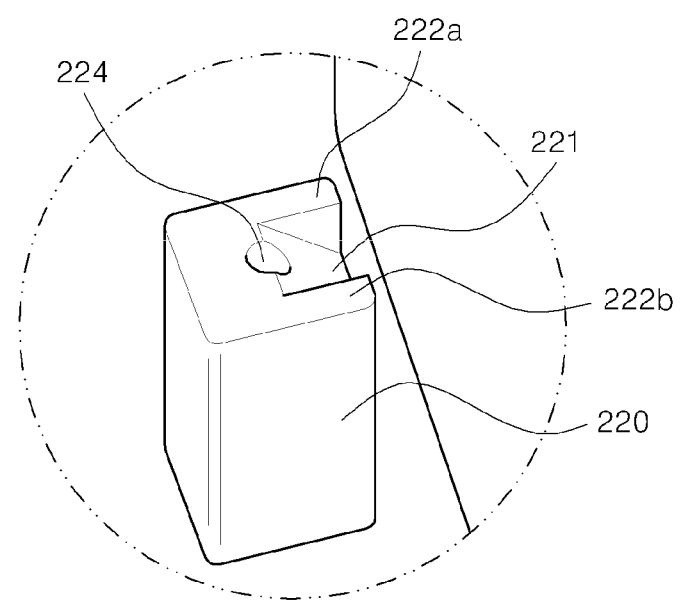
FIG. 4B is a partially enlarged perspective view of FIG. 4A.
Figure 5:
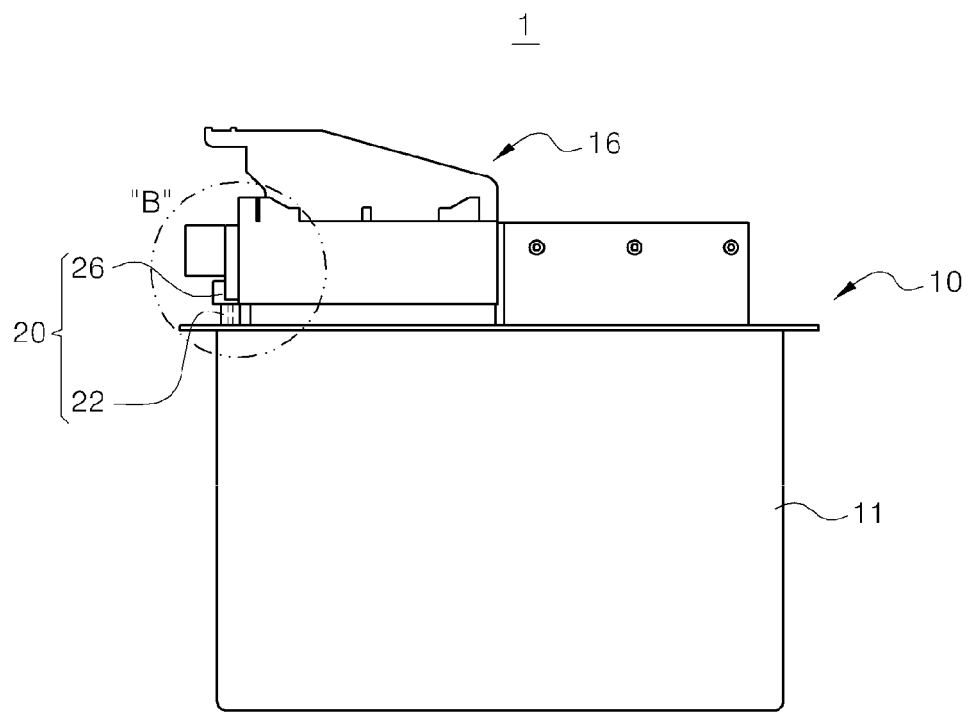
FIG. 5 is a combination front view showing the state in which the ECU and the vehicle-side connector have been combined, which is seen from the front.
Figure 6:
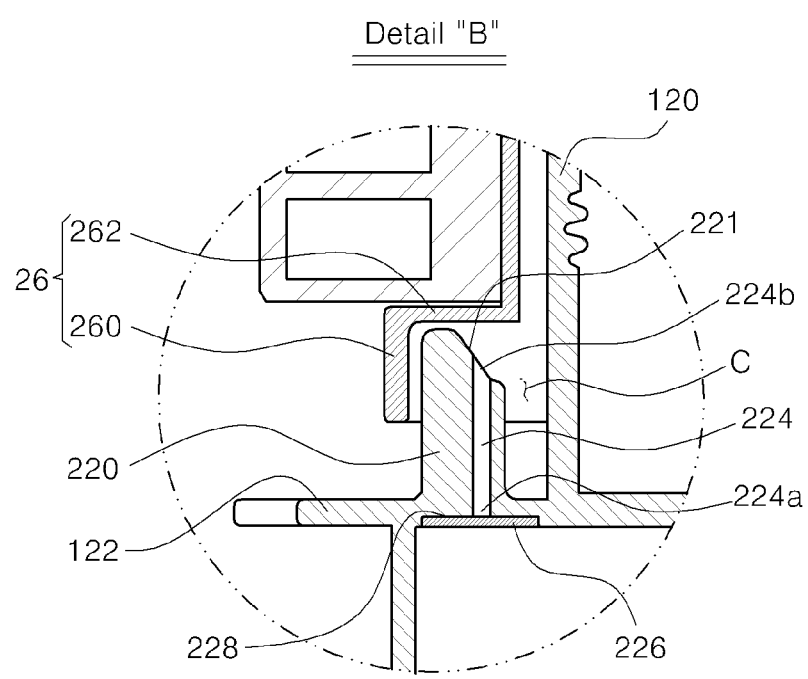
FIG. 6 is a cut-away enlarged view of major elements of the present invention in a "B" part of FIG. 5.

FIG. 4A is an enlarged perspective view of major elements of the present invention in an "A" part in FIG. 3, FIG. 4B is a partially enlarged perspective view of FIG. 4A, and FIG. 5 is a combination front view showing the state in which the ECU and the vehicle-side connector have been combined, which is seen from the front. Furthermore, FIG. 6 is a cut-away enlarged view of major elements of the present invention in a "B" part of FIG. 5.

Referring to FIG. 4A, FIG. 4B, FIG. 5 and FIG. 6, the vent unit 22 of the pressure compensation device 20 is integrated with the ECU-side connector 12 on which the electronic control element has been mounted. A vent hole 224 configured to penetrate the inside and outside of the case 11 of the ECU 10 in which the PCB has been received is lengthily formed along the center of the vent unit 22. The cover unit 26 is integrated on one side of the vehicle-side connector 16 corresponding to the location of the vent unit 22.

The vent unit 22 is formed in a flange 122 on a flat panel placed in the outside of the bottom of the connection part 120 of the ECU-side connector 12 (refer to FIG. 4). The cover unit 26 is formed on one side of the vehicle-side connector 16 corresponding to the location of the vent unit 22 when the ECU-side connector and the vehicle-side connector are coupled. Accordingly, when the ECU-side connector 12 and the vehicle-side connector 16 are coupled, the cover unit 26 covers part of the top of the vent unit 22, thereby forming a protection wall (refer to FIGS. 5 and 6).

More specifically, the vent unit 22 is formed in the height direction of the connection part 120 of the ECU-side connector 12 and includes a pressure control part 220. In this case, a cross section of the pressure control part 220 in which the vent hole 224 has been formed along the central part of the pressure control part 220 is circular or angular. The vent unit 22 includes an air permeability separation membrane 226 of a thin sheet type, which is installed to cover the entrance of the vent hole 224 on the inside of the case 11 of the ECU 10.

The separation membrane 226 functions as safety means for finally blocking the introduction of an alien substance from the outside through the vent hole 224 even though the pressure compensation device 20 is applied. A concave unit 228 having a depth and size corresponding to at least the thickness and size of the separation membrane 226 may be concaved and installed around the entrance of the vent hole 224 so that the separation membrane 226 is stably installed and fixed to the concave unit 228.

An inclined surface 221 including the exit 224b of the vent hole 224 is formed at the front of the pressure control part 220 forming the vent unit 22, as shown in FIGS. 4A, 4B and 6. The inclined surface 221 is formed on the side that faces the side of the connection part 120 of the ECU-side connector 12 so that the exit 224b is placed on the side opposite the side member of the cover unit 26 on the outermost side thereof. Accordingly, the introduction of an alien substance is blocked more certainly.

As shown in FIG. 4B, the inclined surface 221 of the pressure control part 220 may further include sidewalls 222a and 222b configured to surround both sides of the inclined surface 221 higher than the inclined surface 221. In this case, the top surfaces of the sidewalls 222a and 222b may be formed to have the same plane as the top surface of the pressure control part 220 or may be formed to be higher than the top surface of the pressure control part 220.

In this case, the sidewalls 222a and 222b function as defense walls for blocking the penetration of moisture from the side. The inclined surface 221 functions to make externally penetrated moisture downward flow without being stagnated therein.

That is, the cover unit 26 functions to block moisture from entering the vent unit 22. Furthermore, the sidewalls 222a and 222b block moisture again although the moisture is finely penetrated. Although a very small amount of moisture penetrates the front end of the pressure control part 220, the penetration of the moisture can be prevented more certainly because the moisture flows down the inclined surface 221 without being stagnated in the front end.

The cover unit 26 configured to form the protection wall by covering the front end of the pressure control part 220 may include a side member 260 configured to surround part of the upper side of the pressure control part 220 and a top member 262 configured to have a flat panel on top of the side member 260. When the ECU-side connector and the vehicle-side connector are coupled, a specific gap C (i.e., an air flow passage) is formed between the pressure control part 220 and the connection part 120 surrounded by the cover unit 26.

Accordingly, the specific gap C and the vent hole 224 form a consecutive passage of a zigzag form on the basis of the direction in which an alien substance is introduced from the outside. Accordingly, the introduction of an alien substance can be certainly blocked. Furthermore, air within the case 11 which has been heated by heat generated when the PCB is driven is smoothly discharged to the outside of the case 11 through the consecutive passage of a zigzag form, thereby maintaining pressure within the case 11 to a proper level.

Figure 7:
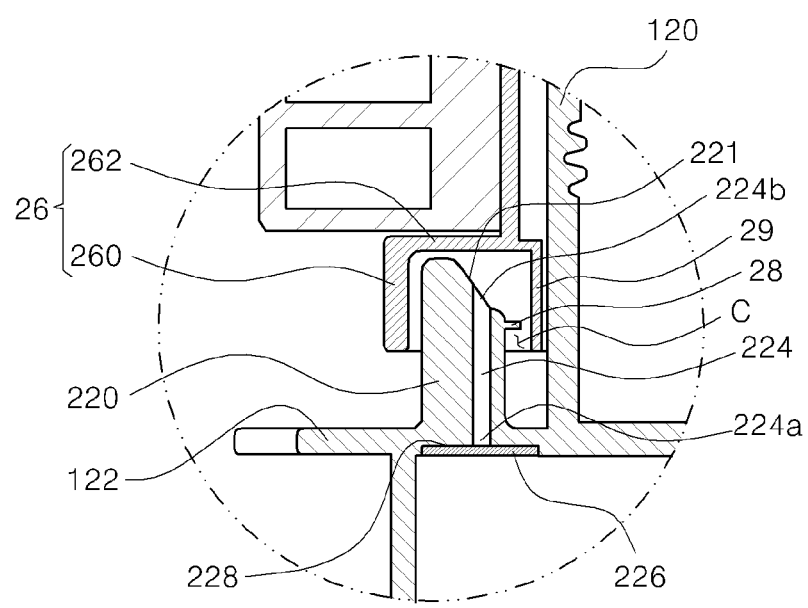
FIG. 7 is a cut-away cross-sectional view showing another embodiment of the pressure compensation device.
Figure 8:
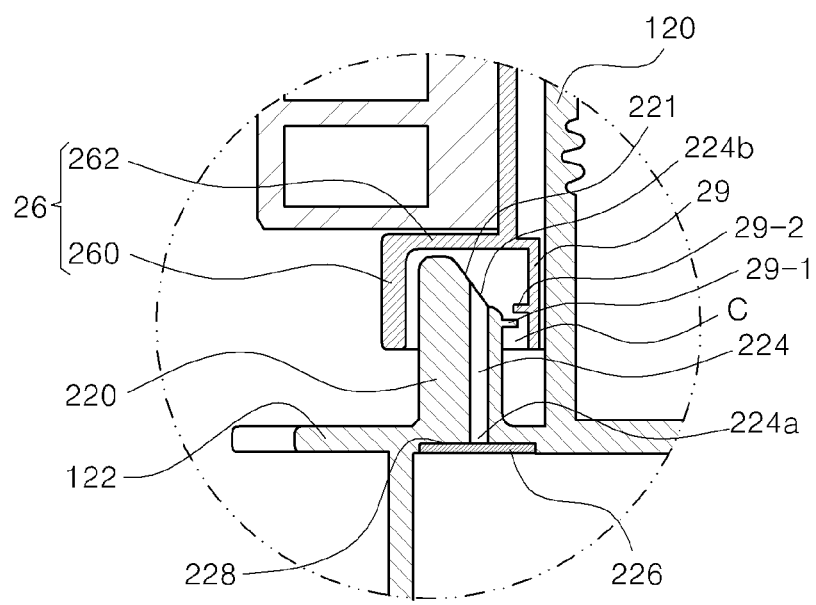
FIG. 8 is a cut-away cross-sectional view showing yet another embodiment of the pressure compensation device.

The pressure compensation device may be provided in forms, such as those of FIGS. 7 and 8 in order to block an alien substance and moisture when the ECU-side connector and the vehicle-side connector are coupled.

FIG. 7 is a cut-away cross-sectional view showing another embodiment of the pressure compensation device. The embodiment of FIG. 7 further includes a barrier member 28 between the vent unit 22 and the connection part 120 of the ECU-side connector 12 when the connectors are assembled. An alien substance introduction prevention piece 29 may be provided on one face that faces the vent unit 22 of the barrier member 28 or an external surface of the vent unit 22 that faces the barrier member 28.

FIG. 8 is a cut-away cross-sectional view showing yet another embodiment of the pressure compensation device. In the embodiment of FIG. 8, in the configuration according to the embodiment of FIG. 7 further including the barrier member 28 and the alien substance introduction prevention piece 29, in order to block the introduction of an alien substance and moisture more certainly, alien substance introduction prevention pieces 29-1 and 29-2 are alternately configured on a face in which the vent unit 22 and the barrier member 28 face each other up and down at a specific interval.

In accordance with the embodiments of the present invention, the pressure compensation device is formed by integrating the vent unit and the cover unit and respectively forming in the ECU-side connector and the vehicle-side connector. Accordingly, a process for producing products can be simplified and productivity can be improved compared to a prior art in which air permeability is secured by separately applying a stopper type filter or a sheet type filter to the case.

Furthermore, there are advantages in terms of a reduction of a production cost and the securing of price competitiveness because a conventional filter having a complicated construction is not required. Furthermore, the overheating of the electronic control element can be effectively prevented because the configuration can be simplified and air permeability can be smoothly secured. Furthermore, the protection structure (i.e., the cover unit) of the vehicle-side connector can perfectly block the introduction of an alien substance, such as moisture through the vent hole.

The aforementioned embodiments of the present invention have been disclosed for illustrative purposes, and the present invention is not restricted by the embodiments. Furthermore, those skilled in the art to which the present invention pertains may modify and change the present invention in various ways within the spirit and scope of the present invention, and such modifications and changes should be construed as belonging to the scope of the present invention.

What is claimed is:

1. A pressure compensation device, comprising:
a vent unit integrated with a connector on a part of an electronic control unit (ECU) on which an electronic control element is mounted, wherein a vent hole penetrating an inside and an outside of a case of the ECU in which the electronic control element is received is formed in the vent unit; and
a cover unit integrated with a vehicle-side connector in such a way as to form electrical connection with the ECU and configured to form a protection wall by covering part of an upper side of the vent unit when the ECU-side connector and the vehicle-side connector are coupled.

2. The pressure compensation device of claim 1, wherein:
the vent unit is formed in a flat panel type flange on an outside of a bottom of a connection part of the ECU-side connector, and
the cover unit is formed on a side of the vehicle-side connector in a location corresponding to the vent unit when the ECU-side connector and the vehicle-side connector are coupled.

3. An ECU module, comprising:
an ECU configured to have an electronic control element mounted on a case and a connector forming electrical connection with the electronic control element coupled to one side of the case;
a vehicle-side connector coupled to the ECU-side connector in such a way as to form electrical connection with the ECU-side connector; and
a pressure compensation device according to claim 2.

4. The pressure compensation device of claim 1, wherein the vent unit comprises:
a pressure control part formed in a height direction of a connection part of the ECU-side connector, wherein a cross section of the pressure control part in which the vent hole is formed along a central part of the pressure control part is angular or circular; and
a separation membrane installed at an entrance of the vent hole on an inside of the case of the ECU.

5. The pressure compensation device of claim 4, wherein an inclined surface comprising an exit of the vent hole is formed at a front end of the pressure control part.

6. An ECU module, comprising:
an ECU configured to have an electronic control element mounted on a case and a connector forming electrical connection with the electronic control element coupled to one side of the case;
a vehicle-side connector coupled to the ECU-side connector in such a way as to form electrical connection with the ECU-side connector; and
a pressure compensation device according to claim 5.

7. The pressure compensation device of claim 5, wherein the inclined surface is formed on a side facing a side of the connection part of the ECU-side connector.

8. An ECU module, comprising:
an ECU configured to have an electronic control element mounted on a case and a connector forming electrical connection with the electronic control element coupled to one side of the case;
a vehicle-side connector coupled to the ECU-side connector in such a way as to form electrical connection with the ECU-side connector; and
a pressure compensation device according to claim 7.

9. The pressure compensation device of claim 5, further comprising sidewalls formed in the inclined surface and configured to surround both sides of the inclined surface.

10. An ECU module, comprising:
an ECU configured to have an electronic control element mounted on a case and a connector forming electrical connection with the electronic control element coupled to one side of the case;
a vehicle-side connector coupled to the ECU-side connector in such a way as to form electrical connection with the ECU-side connector; and
a pressure compensation device according to claim 9.

11. The pressure compensation device of claim 4, wherein a concave unit in which the separation membrane is installed is formed around the entrance of the vent hole.

12. An ECU module, comprising:
an ECU configured to have an electronic control element mounted on a case and a connector forming electrical connection with the electronic control element coupled to one side of the case;
a vehicle-side connector coupled to the ECU-side connector in such a way as to form electrical connection with the ECU-side connector; and
a pressure compensation device according to claim 11.

13. An ECU module, comprising:
- an ECU configured to have an electronic control element mounted on a case and a connector forming electrical connection with the electronic control element coupled to one side of the case;
- a vehicle-side connector coupled to the ECU-side connector in such a way as to form electrical connection with the ECU-side connector; and
- a pressure compensation device according to claim 4.

14. The pressure compensation device of claim 1, wherein the cover unit comprises:
- a side member configured to surround an upper side of the vent unit, and
- a top member on top of the side member.

15. An ECU module, comprising:
- an ECU configured to have an electronic control element mounted on a case and a connector forming electrical connection with the electronic control element coupled to one side of the case;
- a vehicle-side connector coupled to the ECU-side connector in such a way as to form electrical connection with the ECU-side connector; and
- a pressure compensation device according to claim 14.

16. The pressure compensation device of claim 1, further comprising a barrier member placed between the vent unit and the connection part of the ECU-side connector when the ECU-side connector and the vehicle-side connector are coupled.

17. An ECU module, comprising:
- an ECU configured to have an electronic control element mounted on a case and a connector forming electrical connection with the electronic control element coupled to one side of the case;
- a vehicle-side connector coupled to the ECU-side connector in such a way as to form electrical connection with the ECU-side connector; and
- a pressure compensation device according to claim 16.

18. The pressure compensation device of claim 16, wherein an alien substance introduction prevention piece is installed on one surface of the barrier member facing the vent unit or an external surface of the vent unit facing the barrier member.

19. An ECU module, comprising:
- an ECU configured to have an electronic control element mounted on a case and a connector forming electrical connection with the electronic control element coupled to one side of the case;
- a vehicle-side connector coupled to the ECU-side connector in such a way as to form electrical connection with the ECU-side connector; and
- a pressure compensation device according to claim 18.

20. The pressure compensation device of claim 16, wherein alien substance introduction prevention pieces are alternately installed up and down at a specific interval in a face in which the vent unit and the barrier member face each other.

21. An ECU module, comprising:
- an ECU configured to have an electronic control element mounted on a case and a connector forming electrical connection with the electronic control element coupled to one side of the case;
- a vehicle-side connector coupled to the ECU-side connector in such a way as to form electrical connection with the ECU-side connector; and
- a pressure compensation device according to claim 20.

22. An ECU module, comprising:
- an ECU configured to have an electronic control element mounted on a case and a connector forming electrical connection with the electronic control element coupled to one side of the case;
- a vehicle-side connector coupled to the ECU-side connector in such a way as to form electrical connection with the ECU-side connector; and
- a pressure compensation device according to claim 1.

* * * * *